United States Patent
Li et al.

(10) Patent No.: US 12,074,265 B2
(45) Date of Patent: Aug. 27, 2024

(54) LIGHT-SHIELDING FRAME AND LED DISPLAY DEVICE

(71) Applicant: APPOTRONICS CORPORATION LIMITED, Guangdong (CN)

(72) Inventors: Shijie Li, Shenzhen (CN); Xiaofeng Tang, Shenzhen (CN); Zeda Tang, Shenzhen (CN); Yi Li, Shenzhen (CN)

(73) Assignee: APPOTRONICS CORPORATION LIMITED, Shenzhen (CN)

( * ) Notice: Subject to any disclaimer, the term of this patent is extended or adjusted under 35 U.S.C. 154(b) by 399 days.

(21) Appl. No.: 17/648,663

(22) Filed: Jan. 21, 2022

(65) Prior Publication Data

US 2022/0149253 A1    May 12, 2022

Related U.S. Application Data

(63) Continuation of application No. PCT/CN2020/103582, filed on Jul. 22, 2020.

(30) Foreign Application Priority Data

Jul. 23, 2019 (CN) .......................... 201910665832.8

(51) Int. Cl.
*H01L 33/58* (2010.01)
*H01L 25/075* (2006.01)

(52) U.S. Cl.
CPC .......... *H01L 33/58* (2013.01); *H01L 25/0753* (2013.01)

(58) Field of Classification Search
None
See application file for complete search history.

(56) References Cited

U.S. PATENT DOCUMENTS

| 2014/0016301 A1 | 1/2014 | Brown Elliott |
| 2022/0149253 A1* | 5/2022 | Li .......................... H01L 33/58 |

FOREIGN PATENT DOCUMENTS

| CN | 2845074 Y | 12/2006 |
| CN | 201532741 U | 7/2010 |

(Continued)

OTHER PUBLICATIONS

State Intellectual Property Office of the People's Republic of China, Office Action and Search Report Issued in Application No. 201910666832.8, Sep. 5, 2022, 13 pages. (Submitted with Partial Translation).

(Continued)

*Primary Examiner* — Jack S Chen
(74) *Attorney, Agent, or Firm* — McCoy Russell LLP

(57) ABSTRACT

A light-shielding frame and an LED display device are provided and respectively has excellent light-shielding performance and optical display performance. The light-shielding frame includes a retaining wall and hollow grids; the retaining wall includes first and second retaining walls connected in a stacked manner along a light-emitting direction of the grids, and each grid includes first and second grid portions. The thickness of the first retaining wall decreases from one end thereof close to the second retaining wall to the other end thereof distant from the second retaining wall to form a first draft angle; the thickness of the second retaining wall decreases from one end thereof close to the first retaining wall to the other end thereof distant from the first retaining wall to form a second draft angle; the first retaining wall has the same thickness as the second retaining wall in the connection position thereof.

20 Claims, 5 Drawing Sheets

(56) References Cited

FOREIGN PATENT DOCUMENTS

| CN | 201576410 U | 9/2010 |
|---|---|---|
| CN | 202584625 U | 12/2012 |
| CN | 104575307 A | 4/2015 |
| CN | 205491580 U | 8/2016 |
| CN | 106541105 A | 3/2017 |
| CN | 108243587 A | 7/2018 |
| CN | 109119437 A | 1/2019 |
| CN | 208889238 U | 5/2019 |
| FR | 2811798 A1 | 1/2002 |
| JP | 2006162889 A | 6/2006 |

OTHER PUBLICATIONS

ISA China National Intellectual Property Administration, International Search Report Issued in Application No. PCT/CN2020/103582, Sep. 28, 2020, WIPO, 6 pages.

* cited by examiner

US 12,074,265 B2

LIGHT-SHIELDING FRAME AND LED DISPLAY DEVICE

CROSS-REFERENCE TO RELATED APPLICATIONS

This application is a continuation of International Application No. PCT/CN2020/103582, filed on Jul. 22, 2020, which claims priority to Chinese Patent Application No. 201910665832.8, filed on Jul. 23, 2019. All of the aforementioned applications are hereby incorporated by reference in their entireties.

TECHNICAL FIELD

The present disclosure relates to the field of optical projection devices, and in particular, to a light-shielding frame and a light-emitting diode (LED) display device.

BACKGROUND

Optical display of large-screen has gradually entered the field of high-quality video projection. With the maturity of the technology, the application scenarios are gradually expanded. In practical applications, the optical screen is large in size and is usually formed by splicing a plurality of LED display devices.

SUMMARY

An objective of the present disclosure is to provide a light-shielding frame with good shielding effect and an LED display device with good optical display performance.

To achieve the foregoing objective, the present disclosure provides a light-shielding frame, including a shielding wall and hollow grid cells enclosed by the shielding wall and arranged in a matrix. The shielding wall includes a first shielding wall and a second shielding wall that are stacked along a light emitting direction of the grid cells, and each of the grid cells includes a first grid cell portion enclosed by the first shielding wall and a second grid cell portion enclosed by the second shielding wall; the first shielding wall has a thickness that decreases from an end close to the second shielding wall to an end away from the second shielding wall to form a first draft angle; the second shielding wall has a thickness that decreases from an end close to the first shielding wall to an end away from the first shielding wall to form a second draft angle; and the first shielding wall and the second shielding wall have a same thickness at a connection position between the first shielding wall and the second shielding wall.

The present disclosure further provides a light-emitting diode (LED) display device, including the light-shielding frame according to the present disclosure, and an LED assembly and a light-transmitting film layer that are fixed on two opposite sides of the light-shielding frame respectively and spaced apart. The LED assembly includes a flexible circuit board and LED beads, the flexible circuit board is fixed at the end of the first shielding wall away from the second shielding wall, and the LED beads are electrically connected to the flexible circuit board and are accommodated in the grid cells respectively; and the light-transmitting film layer is disposed at the end of the second shielding wall away from the first shielding wall and completely covers all the grid cells.

BRIEF DESCRIPTION OF DRAWINGS

To describe the technical solutions in the embodiments of the present disclosure more clearly, the drawings for describing the embodiments are briefly described below. Apparently, the drawings in the following description show merely some embodiments of the present disclosure, and those of ordinary skill in the art may still derive other drawings from these drawings without creative efforts.

DETAILED DESCRIPTION

The technical solutions of the embodiments of the present disclosure are described below with reference to the drawings. Apparently, the described embodiments are merely some rather than all of the embodiments of the present disclosure. All other embodiments obtained by those of ordinary skill in the art based on the embodiments of the present disclosure without creative efforts should fall within the protection scope of the present disclosure.

In the related art, each LED display device serves as a small unit of the large optical screen. The LED display device includes a light-shielding frame, and a light-transmitting film layer and an LED assembly that are mounted on opposite sides of the light-shielding frame. The LED assembly includes a plurality of LED beads distributed in a matrix. The light-shielding frame forms a plurality of hollow grid cells distributed in a matrix, and the plurality of beads are provided in the plurality of grid cells respectively. In order to achieve a high fill rate of pixel, a certain height of the light-shielding frame is needed.

However, the light-shielding frame is generally made by an injection molding process. Therefore, the structural design of the light-shielding frame needs to consider the feasibility of mold production and injection molding, which limits the size of the light-shielding frame, resulting in poor shielding effect of the light-shielding frame, thus limiting the optical performance of the LED display device using the light-shielding frame.

Figure 1:
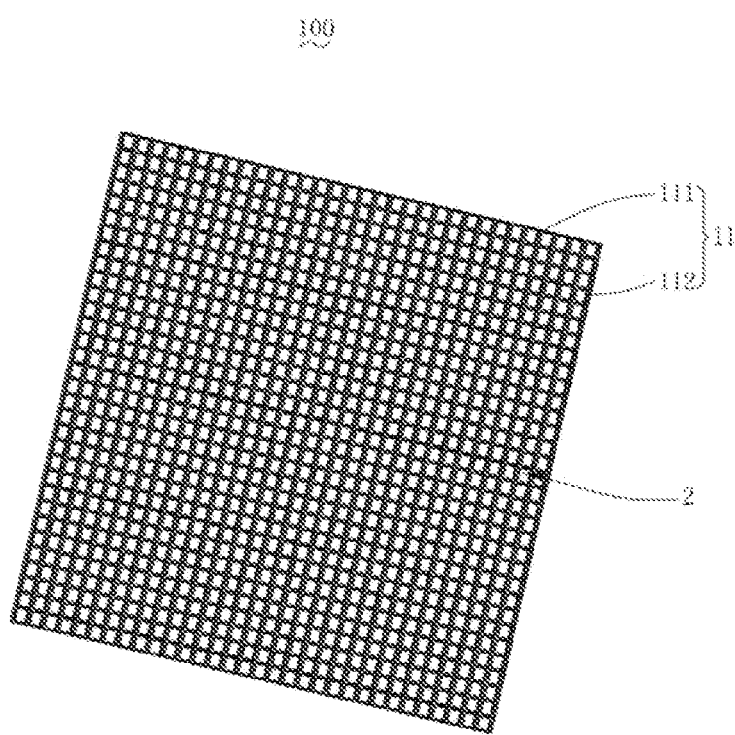
FIG. 1 is a schematic diagram of a three-dimensional structure of a light-shielding frame according to the present disclosure.
Figure 2:
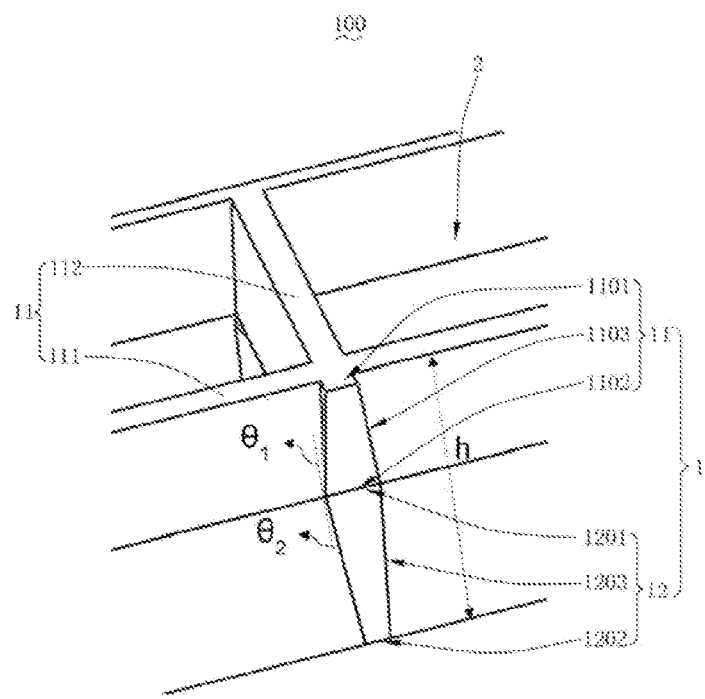
FIG. 2 is a schematic cross-sectional view of the three-dimensional structure of the light-shielding frame according to the present disclosure.
Figure 3:
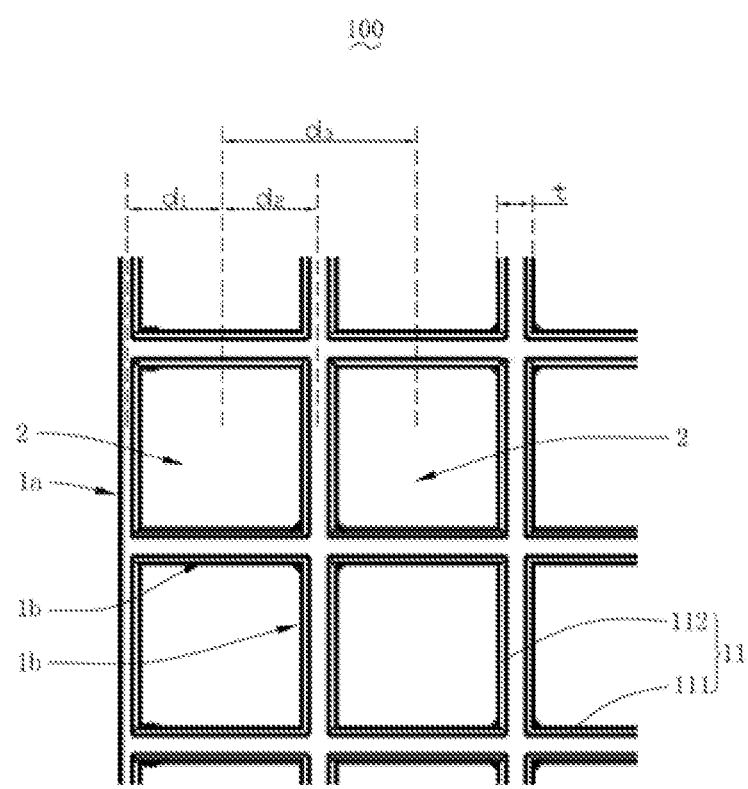
FIG. 3 is a top view of the light-shielding frame according to the present disclosure.
Figure 4:
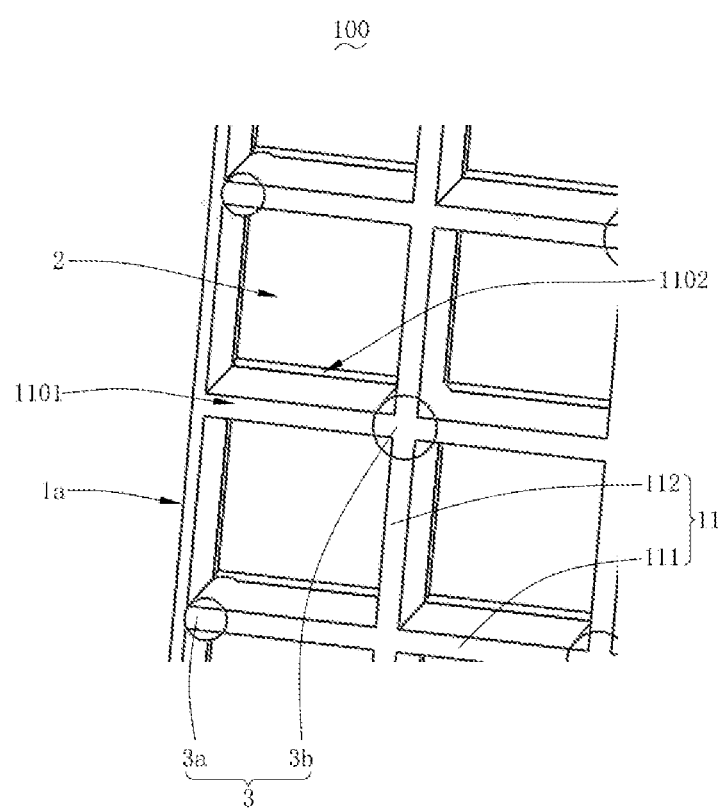
FIG. 4 is a first local enlarged view of a partial three-dimensional structure of the light-shielding frame according to the present disclosure.
Figure 5:
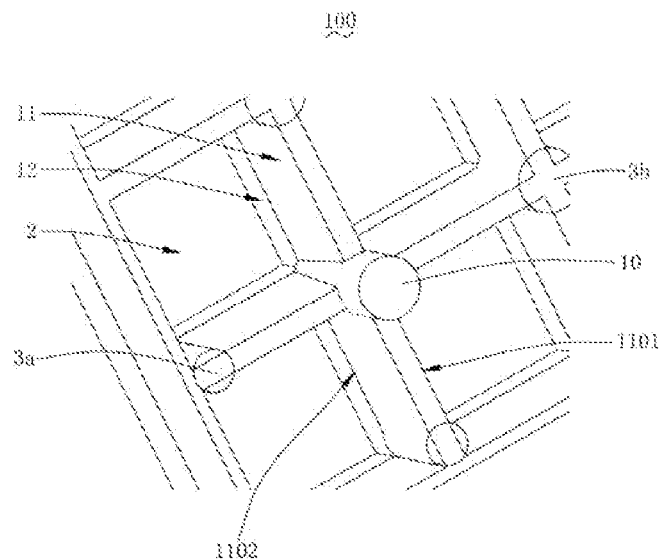
FIG. 5 is a second local enlarged view of a partial three-dimensional structure of the light-shielding frame according to the present disclosure.
Figure 6:
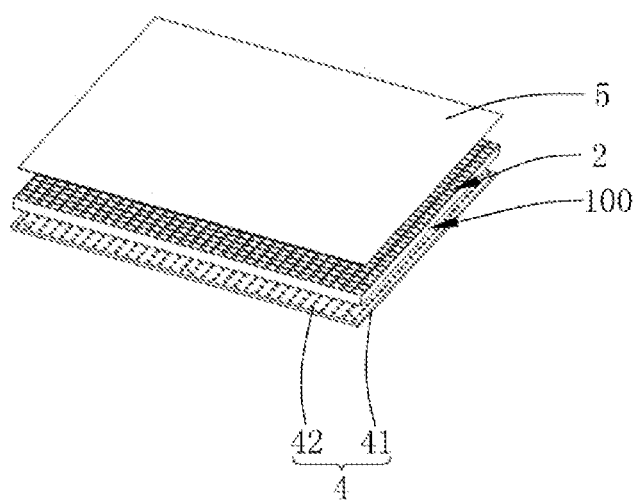
FIG. 6 is a schematic diagram of a three-dimensional structure of an LED display device according to the present disclosure.

Referring to FIG. 1 to FIG. 6, the present disclosure provides a light-shielding frame 100, including a shielding wall 1 and a plurality of hollow grid cells 2 arranged in a matrix.

In an implementation, the plurality of grid cells 2 are enclosed by the shielding wall 1. Specifically, the shielding wall 1 includes a first shielding wall 11 and a second shielding wall 12 connected to each other. The grid cells 2 each include a first grid cell portion (not marked in the figure) enclosed by the first shielding wall 11 and a second grid cell portion (not marked in the figure) enclosed by the second shielding wall 12.

The first shielding wall 11 has a thickness that gradually decreases from an end close to the second shielding wall 12 to an end away from the second shielding wall 12 and forms a first draft angle $\theta_1$; the second shielding wall 12 has a thickness that gradually decreases from an end close to the first shielding wall 11 to an end away from the first shielding wall 11 and forms a second draft angle $\theta_2$; and the first shielding wall 11 and the second shielding wall 12 have a same thickness at a connection position, so that the joint between the first shielding wall 11 and the second shielding wall 12 is continuous.

Further, the first shielding wall 11 includes a first top surface 1101 and a first bottom surface 1102 that are spaced apart from each other, and a first side surface 1103. The first top surface 1101 is located at the end of the first shielding wall 11 away from the second shielding wall 12. The first bottom surface 1102 is located at the end of the first shielding wall 11 close to the second shielding wall 12 and is stacked on the second shielding wall 12. The first side surface 1103 is connected to the first top surface 1101 and the first bottom surface 1102.

The second shielding wall 12 includes a second top surface 1201 and a second bottom surface 1202 that are spaced apart from each other, and a second side surface 1203. The second top surface 1201 is located at the end of the second shielding wall 12 close to the first shielding wall 11 and is connected to the first shielding wall 11. The second bottom surface 1202 is located at the end of the second shielding wall 12 away from the first shielding wall 11. The second side surface 1203 is connected to the second top surface 1201 and the second bottom surface 1202.

Further, the first bottom surface 1102 and the second top surface 1201 completely overlap with each other and jointly act as a parting surface of the light-shielding frame 100, so that the first shielding wall 11 and the second shielding wall 12 have the same thickness at the connection position. The first side surface 1103 is connected to the second side surface 1203, so that the joint between the first shielding wall 11 and the second shielding wall 12 is continuous.

In practice, the light-shielding frame in the related art is made by an open-mold injection process. The light-shielding frame has a relatively small height, which is generally smaller than 1 mm, and demolding after injection is relatively easy. However, when the height is required to be greater than 3 mm, due to the high aspect ratio of the grid cells, the demolding process becomes more difficult, making the production of the light-shielding frame difficult, thus limiting the size design of the light-shielding frame.

Compared with the prior art, by configuring the first draft angle $\theta_1$ and the second draft angle $\theta_2$, the light-shielding frame 100 avoids difficulty in demolding due to the height of the light-shielding frame in the related art, thereby relieving the limitation on the size design of the light-shielding frame 100, making it possible to produce the light-shielding frame 100 having a shielding wall with a high aspect ratio, thereby optimizing the shielding effect of the light-shielding frame 100.

In an embodiment, the first draft angle $\theta_1$ ranges from 5° to 90°, and the second draft angle $\theta2$ range from 5° to 90°. In practice, the values of the first draft angle $\theta_1$ and the second draft angle $\theta_2$ can be adjusted to make the draft of the light-shielding frame 100 easier.

Further, the specific structure form of the light-shielding frame 100 is determined by the first shielding wall 11 and the second shielding wall 12 jointly. Depending on actual use requirements, the height and draft angle of the first shielding wall 11 and the height and draft angle of the second shielding wall 12 can be adjusted, so as to form the light-shielding frame 100 in different structure forms.

For example, in an optional implementation, the first draft angle $\theta_1$ is equal to the second draft angle $\theta_2$. In an embodiment, the height of the first shielding wall 11 is equal to the height of the second shielding wall 12. By configuring the height relationship and the relationship between the draft angles, the second shielding wall 12 and the first shielding wall 11 form a symmetrical structure, so that shielding wall 1 has a structure that is symmetrical about the parting surface, which improves the overall symmetry of the light-shielding frame 100 and provides a beneficial demolding condition for the light-shielding frame 100, thereby making the demolding of the light-shielding frame 100 more convenient.

It is worth mentioning that, the light-shielding frame 100 is an integral structure produced through a double-sided demolding process, that is, the light-shielding frame 100 is produced by releasing the upper and lower molds respectively. The first bottom surface 1102 and the second top surface 1201 completely overlap with each other and are jointly used as the parting surface of the light-shielding frame 100. A width of the parting surface is used as a thickness t of the shielding wall 1. The double-sided demolding process simplifies the production process of the light-shielding frame 100, reduces the production cost, and high production precision of the light-shielding frame 100 can be effectively ensured at the same time.

In practice, LED beads are accommodated in the grid cells 2. Size structures of the grid cells 2, which are used as the minimum shielding units of the light-shielding frame 100, directly affect the shielding effect of the light-shielding frame 100, and the specific configuration of the shielding wall 1 directly decides the size structures of the grid cells 2. The shielding wall 1 with a symmetrical structure is used as an example for description.

In an implementation, the first shielding wall 11 includes a plurality of first transverse walls 111 arranged in parallel at intervals and a plurality of first longitudinal wall 112 arranged in parallel at intervals. The first transverse walls 111 and the first longitudinal wall 112 are perpendicular to each other and arranged in an interlacing manner, and jointly define the plurality of first grid cell portions.

Further, the plurality of first transverse walls 111 are arranged at equal intervals along an extension direction of the first longitudinal wall 112. The plurality of first longitudinal walls 112 are arranged at equal intervals along an extension direction of the first transverse wall 111, so that the plurality of first grid cell portions have consistent dimensions and are uniformly distributed on the light-shielding frame 100.

It should be noted that, the second shielding wall 12 and the first shielding wall 11 are symmetrical with each other. Therefore, the specific structure of the second shielding wall 12 is formed based on the same principle as the specific structure of the first shielding wall 11, the forming structure of the second grid cell portion is the same as the forming structure of the first grid cell portion, and details are not described herein again.

The structure as mentioned above allows the shielding wall 1 to define the plurality of uniformly distributed grid cells 2 having the consistent dimensions, so as to avoid a non-uniform shielding effect caused by inconsistent dimensions of the grid cells, thereby ensuring uniform shielding and a good shielding effect of the light-shielding frame 100.

It is worth mentioning that the height h of the shielding wall 2 is not limited, which is specifically set according to actual design requirements. For example, in this implementation, in order to ensure a relatively high aspect ratio h/t of the light-shielding frame 100, the thickness t of the shielding wall 1 is smaller than 1 mm, and the height h of the shielding wall 1 may be within a range from 4 mm to 7 mm. A high aspect ratio h/t effectively improves the shielding effect of the light-shielding frame 100.

Further, the light-shielding frame 100 is usually made of plastic, which has a significant thermal expansion and contraction effect. Especially, after the thermal expansion, the extrusion between spliced products can lead to deformation of the light-shielding frame 100. Therefore, in this implementation, it should ensure that the size of each grid cell 2 is set appropriately and that a period of two adjacent grid cells 2 is set appropriately. In an implementation, if a distance from a central position of a shielding wall 1a on the edge to a central position of a grid cell on the edge is a first distance $d_1$, a distance from the central position of the grid cell on the edge to a central position of a neighboring shielding wall 1b is second distance $d_2$, and the first distance $d_1$ is smaller than the second distance $d_2$, and a difference between the second distance $d_2$ and the first distance $d_1$ is δd, then the difference δd may be within a range from 0.05 mm to 0.2 mm. A distance between central positions between two adjacent grid cells is a third distance $d_3$, which is a period of the two adjacent grid cells. The third distance $d_3$ is two times the second distance $d_2$, that is, $d_3=2\times d_2$.

It should be noted that, to facilitate demolding of the light-shielding frame 100, ejector-pin portions can be provided on the light-shielding frame 100. For example, in an implementation, a plurality of ejector-pin portions 3 are provided at intersections between the plurality of first transverse walls 111 and the plurality of first longitudinal walls 112. The plurality of ejector-pin portions 3 respectively extend from the first top surface 1101 to the first bottom surface 1102 along the light-emitting direction of the grid cells 2.

Further, the ejector-pin portions 3 include first ejector-pin portions 3a and second ejector-pin portions 3b. The first ejector-pin portions 3a are located at edge positions of the light-shielding frame 100; and the second ejector-pin portions 3b are located within the light-shielding frame 100 and are arranged at intervals with the first ejector-pin portions 3a.

Further, a diameter of each first ejector-pin portion 3a and a diameter of each second ejector-pin portion 3b are each greater than the width of the parting surface, and the diameter of each first ejector-pin portion 3a is smaller than the diameter of each second ejector-pin portion 3b.

Further, two adjacent ejector-pin portions 3 in the same first transverse wall 111 are arranged at an interval of two grid cells 2 along an extension direction of the first transverse wall 111. Two adjacent ejector-pin portions 3 in the same first longitudinal wall 112 are arranged at an interval of two grid cells 2 along an extension direction of the first longitudinal wall 112.

It should be noted that, positions where the first ejector-pin portions and the second ejector-pin portions are provided on the light-shielding frame are not limited. It is feasible to provide the first ejector-pin portions and second ejector-pin portions at one end of the light-shielding frame, that is, the first ejector-pin portions and the second ejector-pin portions may be provided only on the first shielding wall or only on the second shielding wall. It is also feasible to provide the first ejector-pin portions and the second ejector-pin portions on two opposite ends of the light-shielding frame, that is, the first ejector-pin portions and the second ejector-pin portions are provided on both the first shielding wall and the second shielding wall.

Since the first shielding wall and the second shielding wall are symmetrical to each other, the principle of providing the first ejector-pin portions and the second ejector-pin portions on the second shielding wall is the same as the principle of providing them on the first shielding wall, and details are not described herein again. Specific configuration of the first ejector-pin portions and the second ejector-pin portions may be specifically designed according to actual demolding requirements.

In the structure as mentioned above, the first ejector-pin portions 3a and the second ejector-pin portions 3b all extend towards outside from the parting surface, thus preventing the structure from being upside down in demolding. By configuring the first ejector-pin portions 3a and the second ejector-pin portions 3b, the demolding difficulty of the light-shielding frame 100 is further reduced.

The present disclosure further provides an LED display device 200, which includes the light-shielding frame 100 of the present disclosure, and an LED assembly 4 and a light-transmitting film layer 5 that are fixed on two opposite sides of the light-shielding frame 100 and spaced apart.

In an implementation, the LED assembly 4 includes a flexible circuit board 41 and a plurality of LED beads 42. The flexible circuit board 41 is fixed at an end of the first shielding wall 11 away from the second shielding wall 12. The plurality of LED beads 42 are electrically connected to the flexible circuit board 41 and are accommodated in the plurality of grid cells 2 respectively.

Further, the number of the LED beads 42 matches the number of the grid cells 2, and the plurality of LED bead 42 are in one-to-one correspondence with the grid cells 2, thereby effectively improving the display performance of the LED display device 200.

The light-transmitting film layer 5 is disposed at an end of the second shielding wall 12 away from the first shielding wall 11 and completely covers all the grid cells 2.

In the structure as mentioned above, the light-shielding frame 100 has a good shading effect for light emitted by the LED beads 42, thus effectively avoiding light crosstalk between pixels, so that the LED display device 200 has good optical display performance. When the LED display device 200 is used outdoors, the optical film layer 4 is waterproof and dustproof, effectively protecting the LED beads 42 within the grid cells 2. Moreover, the optical film layer 4 can be used as an optical diffusion layer of the LED display device 200, so that the light irradiated on the optical film layer 4 can be better diffused, thus effectively improving the optical display performance of the LED display device 200. In addition, when the LED display device 200 is used in the field of 3D display, the optical film layer 4 can be used as a deflection layer of the LED display device 200, so that the effect of 3D projection is better, thus improving viewing experience of viewers.

In an embodiment, the flexible circuit board 41 is provided with a plurality of positioning holes penetrating therethrough (not marked in the figure). The first shielding wall 11 is provided with a plurality of positioning posts 10 at positions corresponding to the positioning holes. The plurality of positioning posts 10 respectively extends from the first bottom surface 1102 into the plurality of positioning holes along the light-emitting direction of the grid cells 2 and are fixed. That is, the positioning posts 10 extend towards outside from the parting surface, thus preventing the structure from being upside down in demolding, thereby ensuring the demolding reliability of the light-shielding frame 100.

It should be noted that, the positions of the positioning holes and the positioning posts are not limited. For example, in this implementation, the positioning holes are arranged relative to the intersections between the first transverse walls 111 and the first longitudinal walls 112. That is, the positioning posts 10 are arranged at the intersections between the first transverse walls 111 and the first longitudinal walls 112, and the positioning posts 10 and the ejector-pin portions 3 are arranged at intervals.

In the structure as mentioned above, the positioning posts 10 and the positioning holes cooperate with each other, so that the fixing between the LED assembly 4 and the light-shielding frame 100 is more reliable. It is worth mentioning that, a diameter of each positioning post 10 is greater than 1.5 mm.

In an embodiment, the first draft angle ranges from 5° to 90°.

In an embodiment, the second draft angle ranges from 5° to 90°.

In an embodiment, the first draft angle is equal to the second draft angle.

In an embodiment, a height of the first shielding wall is equal to that of the second shielding wall.

In an embodiment, the light-shielding frame is an integral structure formed by a double-sided draft process.

In an embodiment, the first shielding wall includes first transverse walls arranged in parallel at intervals and first longitudinal walls arranged in parallel at intervals; and the first transverse walls and the first longitudinal walls are perpendicular to each other and arranged in an interlacing manner, and jointly define the first grid cell portions of the grid cells.

In an embodiment, the first shielding wall includes a first top surface and a first bottom surface that are spaced apart, the first top surface is located at the end of the first shielding wall away from the second shielding wall, and the first bottom surface is located at the end of the first shielding wall close to the second shielding wall and is stacked on the second shielding wall.

In an embodiment, ejector-pin portions are disposed at intersection positions between the first transverse walls and the first longitudinal walls, and the ejector-pin portions respectively extend from the first top surface to the first bottom surface along the light-emitting direction of the grid cells.

In an embodiment, two adjacent ejector-pin portions in one first transverse wall are arranged at an interval of two grid cells along an extension direction of the first transverse wall, and two adjacent ejector-pin portions in one first longitudinal wall are arranged at an interval of two grid cells along an extension direction of the first longitudinal wall.

In an embodiment, the LED assembly includes a flexible circuit board and LED beads, the flexible circuit board is fixed at the end of the first shielding wall away from the second shielding wall, and the LED beads are electrically connected to the flexible circuit board and are accommodated in the grid cells respectively.

In an embodiment, the light-transmitting film layer is disposed at the end of the second shielding wall away from the first shielding wall and completely covers all the grid cells.

In an embodiment, the LED beads are in a one-to-one correspondence with the grid cells.

In an embodiment, the flexible circuit board is provided with positioning holes penetrating there-through; the first shielding wall includes a first top surface and a first bottom surface that are spaced apart, the first top surface is located at the end of the first shielding wall away from the second shielding wall, and the first bottom surface is located at the end of the first shielding wall close to the second shielding wall and is stacked on the second shielding wall; the first shielding wall is provided with positioning posts at positions corresponding to the positioning holes, and the positioning posts respectively extend from the first bottom surface to the positioning holes along the light-emitting direction of the grid cells and are fixed.

In an embodiment, a diameter of each of the positioning posts is greater than 1.5 mm.

In an embodiment, the first bottom surface and the second top surface completely overlap with each other and jointly act as a parting surface of the light-shielding frame; the first shielding wall is provided thereon with ejector-pin portions, and the ejector-pin portions include first ejector-pin portions and second ejector-pin portions; and the first ejector-pin portions and the second ejector-pin portions all extend towards outside from the parting surface of the light-shielding frame.

In an embodiment, the ejector-pin portions include first ejector-pin portions and second ejector-pin portions, the first ejector-pin portions are located at edge positions of the light-shielding frame, and the second ejector-pin portions are located within the light-shielding frame and are arranged at intervals with the first ejector-pin portions.

In an embodiment, the shielding wall has a thickness smaller than 1 mm, and a height ranging from 4 mm to 7 mm.

In an embodiment, a distance from a central position of the shielding wall located on an edge to a central position of a grid cell located on an edge is defined as a first distance $d_1$, and a distance from a central position of a grid cell located on an edge to a central position of a neighboring shielding wall is defined as a second distance $d_2$, where $d_1 < d_2$, and $\delta d = d2 - d1$ and $0.05 \text{ mm} < \delta d < 0.21 \text{mm}$; and a distance between central positions between two adjacent grid cells is defined as a third distance d3, which is a period of the two adjacent grid cells, and $d_3 = 2 \times d_2$.

Compared with the related art, the light-shielding frame of the present disclosure includes a shielding wall and a plurality of hollow grid cells enclosed by the shielding wall and arranged in a matrix, where the shielding wall includes a first shielding wall and a second shielding wall that are stacked along a light-emitting direction of the grid cells, and each of the grid cells includes a first grid cell portion enclosed by the first shielding wall and a second grid cell portion enclosed by the second shielding wall; the first shielding wall has a thickness that gradually decreases from an end close to the second shielding wall to an end away from the second shielding wall and forms a first draft angle; the second shielding wall has a thickness that gradually decreases from an end close to the first shielding wall to an end away from the first shielding wall and forms a second draft angle; the first shielding wall and the second shielding wall have a same thickness at a connection position. In the structure as mentioned above, by configuring the first draft angle and the second draft angle, the first shielding wall and the second shielding wall form certain draft angles, thereby avoiding difficulty in demolding due to the relatively large thickness of the first shielding wall and the second shielding wall, relieving the limitation on the size design of the light-shielding frame, and optimizing the shielding effect of the light-shielding frame. The light-shielding frame achieves a good shielding effect for light emitted by the LED beads, thereby effectively avoiding light crosstalk between pixels, so that the LED display device has good optical display performance.

The above described are merely implementations of the present disclosure. It should be noted here that those of ordinary skill in the art may make improvements without departing from the concept of the present disclosure, but such improvements should fall within the protection scope of the present disclosure.

The invention claimed is:

1. A light-shielding frame, comprising a shielding wall and hollow grid cells enclosed by the shielding wall and arranged in a matrix, wherein the shielding wall comprises a first shielding wall and a second shielding wall that are stacked along a light-emitting direction of the grid cells, and each of the grid cells comprises a first grid cell portion enclosed by the first shielding wall and a second grid cell portion enclosed by the second shielding wall; the first shielding wall has a thickness that decreases from an end close to the second shielding wall to an end away from the second shielding wall to form a first draft angle; the second shielding wall has a thickness that decreases from an end close to the first shielding wall to an end away from the first shielding wall to form a second draft angle; and the first shielding wall and the second shielding wall have a same thickness at a connection position between the first shielding wall and the second shielding wall.

2. The light-shielding frame according to claim 1, wherein the first draft angle ranges from 5° to 90°.

3. The light-shielding frame according to claim 1, wherein the second draft angle ranges from 5° to 90°.

4. The light-shielding frame according to claim 1, wherein the first draft angle is equal to the second draft angle.

5. The light-shielding frame according to claim 1, wherein a height of the first shielding wall is equal to that of the second shielding wall.

6. The light-shielding frame according to claim 1, wherein the light-shielding frame is an integral structure formed by a double-sided draft process.

7. The light-shielding frame according to claim 1, wherein the first shielding wall comprises first transverse walls arranged in parallel at intervals and first longitudinal walls arranged in parallel at intervals; and the first transverse walls and the first longitudinal walls are perpendicular to each other and arranged in an interlacing manner, and jointly define the first grid cell portions of the grid cells.

8. The light-shielding frame according to claim 7, wherein the first shielding wall comprises a first top surface and a first bottom surface that are spaced apart, the first top surface is located at the end of the first shielding wall away from the second shielding wall, and the first bottom surface is located at the end of the first shielding wall close to the second shielding wall and is stacked on the second shielding wall.

9. The light-shielding frame according to claim 8, wherein ejector-pin portions are disposed at intersection positions between the first transverse walls and the first longitudinal walls, and the ejector-pin portions respectively extend from the first top surface to the first bottom surface along the light-emitting direction of the grid cells.

10. The light-shielding frame according to claim 9, wherein two adjacent ejector-pin portions in one first transverse wall are arranged at an interval of two grid cells along an extension direction of the first transverse wall, and two adjacent ejector-pin portions in one first longitudinal wall are arranged at an interval of two grid cells along an extension direction of the first longitudinal wall.

11. The light-shielding frame according to claim 9, wherein the ejector-pin portions comprise first ejector-pin portions and second ejector-pin portions, the first ejector-pin portions are located at edge positions of the light-shielding frame, and the second ejector-pin portions are located within the light-shielding frame and are arranged at intervals with the first ejector-pin portions.

12. The light-shielding frame according to claim 1, wherein the shielding wall has a thickness smaller than 1 mm, and a height ranging from 4 mm to 7 mm.

13. The light-shielding frame according to claim 1, wherein a distance from a central position of the shielding wall located on an edge to a central position of a grid cell located on an edge is defined as a first distance $d_1$, and a distance from a central position of a grid cell located on an edge to a central position of a neighboring shielding wall is defined as a second distance $d2$, where $d1<d2$, and $\delta d=d2-d1$ and $0.05$ mm$<\delta d<0.2$ mm; and a distance between central positions between two adjacent grid cells is defined as a third distance $d3$, which is a period of the two adjacent grid cells, and $d_3=2\times d_2$.

14. An LED display device, comprising a light-shielding frame, and an LED assembly and a light-transmitting film layer that are fixed on two opposite sides of the light-shielding frame respectively and spaced apart, wherein the light-shielding frame comprises a shielding wall and hollow grid cells enclosed by the shielding wall and arranged in a matrix, wherein the shielding wall comprises a first shielding wall and a second shielding wall that are stacked along a light-emitting direction of the grid cells, and each of the grid cells comprises a first grid cell portion enclosed by the first shielding wall and a second grid cell portion enclosed by the second shielding wall; the first shielding wall has a thickness that decreases from an end close to the second shielding wall to an end away from the second shielding wall to form a first draft angle; the second shielding wall has a thickness that decreases from an end close to the first shielding wall to an end away from the first shielding wall to form a second draft angle; and the first shielding wall and the second shielding wall have a same thickness at a connection position between the first shielding wall and the second shielding wall.

15. The LED display device according to claim 14, wherein the LED assembly comprises a flexible circuit board and LED beads, the flexible circuit board is fixed at the end of the first shielding wall away from the second shielding wall, and the LED beads are electrically connected to the flexible circuit board and are accommodated in the grid cells respectively.

16. The LED display device according to claim 14, wherein the light-transmitting film layer is disposed at the end of the second shielding wall away from the first shielding wall and completely covers all the grid cells.

17. The LED display device according to claim 15, wherein the LED beads are in a one-to-one correspondence with the grid cells.

18. The LED display device according to claim 15, wherein the flexible circuit board is provided with positioning holes penetrating there-through; the first shielding wall comprises a first top surface and a first bottom surface that are spaced apart, the first top surface is located at the end of the first shielding wall away from the second shielding wall, and the first bottom surface is located at the end of the first shielding wall close to the second shielding wall and is stacked on the second shielding wall; the first shielding wall is provided with positioning posts at positions corresponding to the positioning holes, and the positioning posts respectively extend from the first bottom surface to the positioning holes along the light-emitting direction of the grid cells and are fixed.

19. The LED display device according to claim 18, wherein a diameter of each of the positioning posts is greater than 1.5 mm.

20. The LED display device according to claim 18, wherein the first bottom surface and the second top surface completely overlap with each other and jointly act as a parting surface of the light-shielding frame; the first shielding wall is provided thereon with ejector-pin portions, and the ejector-pin portions comprise first ejector-pin portions and second ejector-pin portions; and the first ejector-pin portions and the second ejector-pin portions all extend towards outside from the parting surface of the light-shielding frame.

* * * * *